United States Patent
Maekawa

[11] Patent Number: 6,054,743
[45] Date of Patent: *Apr. 25, 2000

[54] HIGH VOLTAGE MOS TRANSISTOR

[75] Inventor: Hisayuki Maekawa, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/696,460

[22] Filed: Aug. 14, 1996

[30] Foreign Application Priority Data

Aug. 17, 1995 [JP] Japan .................................. 7-209402

[51] Int. Cl.$^7$ .......................... H01L 29/76; H01L 29/94; H01L 31/062; H01L 31/113
[52] U.S. Cl. .......................................... 257/408; 257/345
[58] Field of Search ..................... 257/344, 408, 257/371, 372, 368, 139, 327, 336, 339, 349, 376, 192, 194, 345; 438/172

[56] References Cited

U.S. PATENT DOCUMENTS

| | | | |
|---|---|---|---|
| 4,128,439 | 12/1978 | Jambotkar | 357/23 |
| 4,132,998 | 1/1979 | Dingwall | 257/339 |
| 4,409,607 | 10/1983 | Rumennik | 257/327 |
| 4,876,213 | 10/1989 | Pfiester | 257/408 |
| 4,978,626 | 12/1990 | Poon et al. | 257/408 |
| 5,023,190 | 6/1991 | Lee et al. | 257/408 |
| 5,047,813 | 9/1991 | Harada | 257/341 |
| 5,060,033 | 10/1991 | Takeuchi | 257/344 |
| 5,196,908 | 3/1993 | Kusunoki et al. | 257/327 |
| 5,341,011 | 8/1994 | Hshieh et al. | 257/408 |
| 5,420,449 | 5/1995 | Oji | 257/408 |
| 5,424,567 | 6/1995 | Chen | 257/344 |
| 5,440,165 | 8/1995 | Mitsunaga et al. | 257/408 |
| 5,466,958 | 11/1995 | Kakumu | 257/408 |
| 5,498,887 | 3/1996 | Ohki et al. | 257/344 |
| 5,525,822 | 6/1996 | Vinal | 257/408 |
| 5,548,148 | 8/1996 | Bindal | 257/335 |
| 5,586,073 | 12/1996 | Hiura | 365/185.01 |

FOREIGN PATENT DOCUMENTS

| | | | |
|---|---|---|---|
| 0 109 692 A1 | 5/1984 | European Pat. Off. | |
| 44 37 759 A1 | 4/1995 | Germany. | |
| 61-105868 | 5/1986 | Japan | 257/408 |
| 61-171165 | 8/1986 | Japan. | |
| WO 91/01570 | 7/1991 | WIPO | 257/368 |

OTHER PUBLICATIONS

"High Voltage 80 V CMOS Process", Takeichi et al., Oki Denki Kenkyu Kaihatsu, vol. 57, No. 4, Oct. 1990, pp. 87–90.

Patent Abstrscts of Japan vol. 008, No. 217 (E–270), Oct. 4, 1984 & JP 59 100570 A (Nissan Jidosha KK), Jun. 9, 1984, *abstract*.

*Primary Examiner*—Olik Chaudhuri
*Assistant Examiner*—Phat X. Cao
*Attorney, Agent, or Firm*—Jones Volentine, LLP

[57] ABSTRACT

A high voltage MOS (Metal Oxide Semiconductor) transistor includes a semiconductor substrate of first conductivity type (P type). A pair of first diffused layers of second conductivity type (N type) are formed on the substrate. A pair of second diffused layers of second conductivity type (N type) are respectively formed in the first diffused layers and have a higher concentration than the first diffused layers. A gate region intervenes between the two first diffused layers facing each other. The gate region consists of a gate oxide film and a gate electrode. The distance between the first diffused layers is smaller in the deep region of the substrate than at the surface of the substrate. The MOS transistor has a great breakdown resisting quantity.

1 Claim, 9 Drawing Sheets

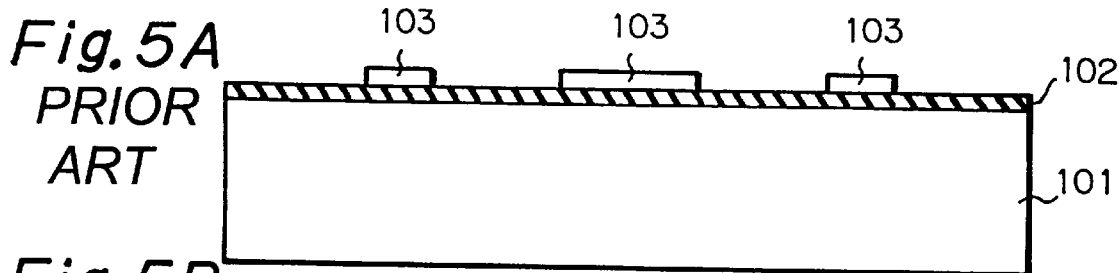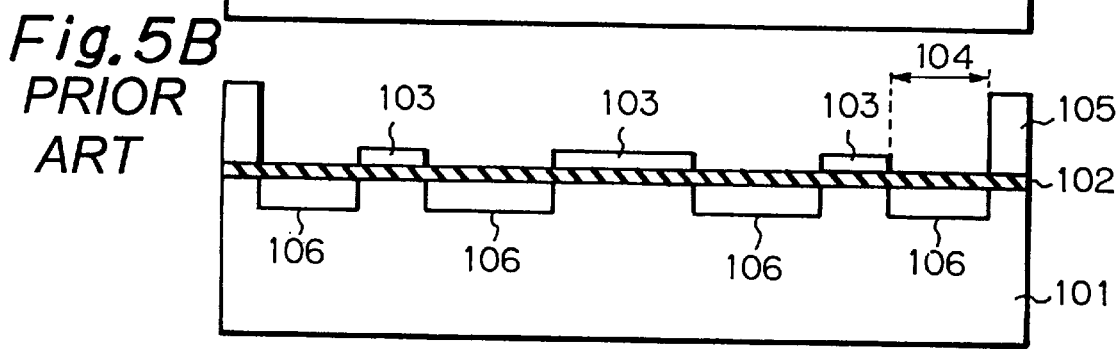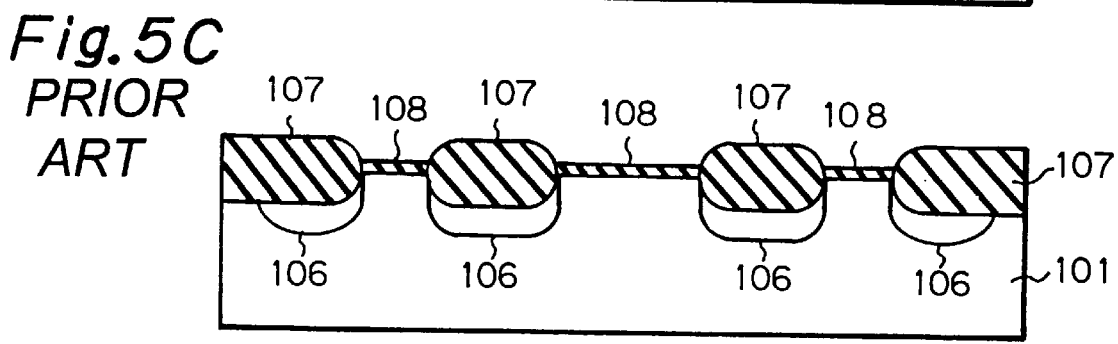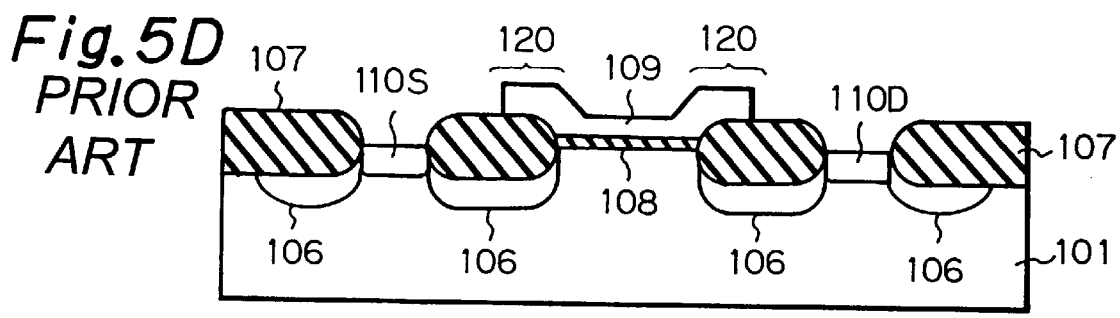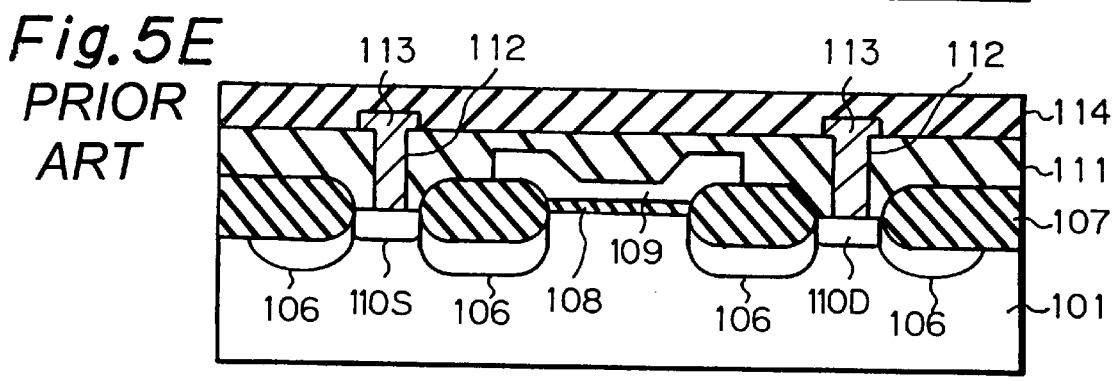

6,054,743

HIGH VOLTAGE MOS TRANSISTOR

BACKGROUND OF THE INVENTION

1. Field of the Invention

The present invention relates to a semiconductor device and, more particularly, to a high voltage MOS (Metal Oxide Semiconductor) transistor, and a method of producing the same.

2. Description of the Background Art

A semiconductor device of the kind described may be provided with an offset gate therein, as taught in, e.g., Japanese Patent Laid-Open Publication No. 61-171165. To better understand the present invention, a procedure for producing one of conventional offset gate MOS transistors will be described with reference to FIGS. 5A–5E.

First, as shown in FIG. 5A, a P type silicon substrate 101 is subjected to thermal oxidation in order to form an about 50 nm thick oxide film 102 in the surface thereof. Subsequently, a 100 nm thick nitride film or similar oxidation resistant film is formed on the entire oxide film 102. Then, a pattern 103 is formed on the oxidation resistant film by conventional photolithographic etching.

As shown in FIG. 5B, a photoresist pattern 105 is formed on the oxide film 102 outside of the pattern 103 by conventional photolithography. The photoresist pattern 105 is spaced from the pattern 103 by a distance 104. The photoresist pattern 105 sets up a preselected distance between a channel stopper layer, not shown, and offset layers 106 which will be described. Subsequently, phosphor (P) is introduced into the substrate 101 in a dose of $1E13/cm^2$ by conventional ion implantation with the patterns 103 and 105 serving as a mask. As a result, the above-mentioned offset layers 106 are formed in the substrate 101.

After the photoresist pattern 105 shown in FIG. 5B has been removed, the above laminate is oxidized at 1,000° C. for about 400 minutes in a vapor atmosphere with the pattern 103 serving as a mask. As a result, as shown in FIG. 5C, an about 1,000 nm thick oxide film 107 is formed on the substrate 101 except for the portions masked by the pattern 103. Then, the pattern or mask 103 and oxide film 102 are removed from the substrate 101. An about 100 nm gate oxide film 108 is newly formed by thermal oxidation in the regions of the substrate 101 from which the pattern 103 has been removed.

Polycrystalline silicon (Poly-Si) is deposited by CVD (Chemical Vapor Deposition) on the laminate shown in FIG. 5C. Then, as shown in FIG. 5D, the Poly-Si layer is removed by photolithographic etching from the regions other than the gate region of a MOS transistor so as to form a gate electrode 109. Next, an $N^+$ type source diffused layer 110S and an $N^+$ type drain diffused layer 110D are formed by conventional photolithographic ion implantation.

As shown in FIG. 5E, a PSG/BPSG (Phosphor-Silicate Glass/Boron-doped PSG) or similar insulating film 111 is formed on the laminate produced by the step of FIG. 5D. Contact holes 112 are formed throughout the insulating film 111. Subsequently, aluminum alloy or similar wiring metal 113 is formed. Finally, a nitride film or similar passivation film 114 is formed on the entire surface of the laminate.

By the above procedure, an offset gate MOS transistor is produced.

The conventional MOS transistor described above has some problems left unsolved, as follows. As shown in FIG. 6 schematically, the source (emitter) 110S, substrate (base) 101 and drain (collector) 110D constitute a parasitic bipolar transistor. Because the parasitic bipolar transistor is located in close proximity to the surface of the substrate 101, a surge current derived from, e.g., static electricity flows only through the narrow junction of the surface of the substrate 101, as indicated by an arrow in FIG. 6. As a result, heat generated by the surge current is not scattered in the substrate 101. This reduces a breakdown resisting quantity available with the transistor.

Specifically, the words "breakdown resisting quantity" refer to the breakdown power of a semiconductor device ascribable to static electricity. Because the breakdown power of a semiconductor device is difficult to measure, the breakdown resisting quantity is often determined in terms of a breakdown voltage. For the measurement of the breakdown voltage, a capacitance and a resistance prescribed by, e.g., JIS (Japanese Industrial Standards) or MIL (Military Specification and Standards) are connected to the device, and then a surge current is caused to flow through the device.

Why the breakdown resisting quantity of the conventional MOS transistor shown in FIG. 5E is low is as follows. A surge current flows through the narrow portion of the surface of the substrate 101, as stated above. This noticeably elevates the temperature of the transistor and thereby lowers the resistance of the region (PN junction) through which the current flows. As a result, more current flows through the above region of the transistor and further lowers the resistance, resulting in thermal crash. Consequently, the region through which the current flows melts and breaks the transistor.

Ordinary MOS transistors for 5 V applications allow an avalanche current derived from a surge current to be scattered in the widthwise direction of a gate. Therefore, this kind of MOS transistor has the breakdown resisting quantity dependent on the gate width. However, as shown in FIG. 7, the conventional offset gate MOS transistor causes the avalanche current to concentrate on the corner portion 110C of the drain diffused layer 110D. In this condition, the breakdown resisting quantity cannot be increased even if the gate width is increased. Consequently, the offset gate MOS transistor needs an exclusive protection device which undesirably increases the chip area. The ordinary MOS transistor for 5V applications and the offset gate MOS transistor of FIG. 5E will be compared hereinafter.

Referring to FIGS. 10, 11 and 12, the MOS transistor for 5V applications is shown. As shown in FIG. 12, when a surge is applied to the transistor, a current or avalanche current 130 flows through the transistor while being scattered in the widthwise direction of the gate. Why such a scattered flow occurs will be described in detail. FIG. 10 is a section of the above transistor. FIG. 11 shows the electric field distribution of the transistor shown in FIG. 10, i.e., equipotential lines 350; a drain voltage is applied when the gate voltage is 0 V. FIG. 12 is a top plan view showing the transistor of FIG. 10.

As shown in FIG. 10, the transistor has a drain layer 310 and a source layer 320 which are diffused layers. The diffused layers 310 and 320 have their edges 331 positioned just below the edges 330 of a gate electrode 309 with the intermediary of a thin gate oxide film 308. Because the edges 330 of the gate electrode 309 overlie and adjoin the diffused layers 310 and 320, the potential of the electrode 309 effects the potential distribution in a substrate 301. As shown in FIG. 11, the equipotential lines 350 in the diffused layers 310 and 320 are bent at the edge 330 of the gate electrode 309. As a result, the potential density is increased in the diffused layer 310 underlying the edge 330 of the gate electrode 309, as also shown in FIG. 11. This occurs over a width 340 shown in FIG. 12 and forms a high voltage region below the edge 330 of the gate electrode 309. In this condition, the surge current 130 flows over the width 340 of the gate electrode 309. This is why the breakdown resisting quantity of the transistor depends on the width of the gate electrode 309.

A reference will be made to FIGS. 5E, 6 and 7 for describing the concentration of the avalanche current on the corner 110C of the drain diffused layer 110D of the conventional offset gate MOS transistor. As shown in FIG. 6, the drain diffused layer 110D is spaced from the edge 130 of the gate electrode 109 in the horizontal direction. In the vertical direction as viewed in FIG. 6, the oxide film 107 thicker than the gate oxide film 108 intervenes between the edge 130 of the gate electrode 109 and the offset layer 106. In this configuration, the potential of the edge 130 of the gate electrode 109 has little influence on the potential distribution in the substrate 101 and the drain diffused layer 110D. It follows that the potential distribution in the drain diffused layer 110D is determined mainly by the shape of the layer 110D itself. Because the uniform extension of a depletion layer is obstructed more in a diffused region having a smaller radius of curvature (e.g. corner), a high voltage is generated in such a diffused region and causes avalanche breakdown to occur.

SUMMARY OF THE INVENTION

It is therefore an object of the present invention to provide a high voltage MOS transistor having a great breakdown resisting quantity, and a method of producing the same.

In accordance with the present invention, a high voltage MOS transistor has a semiconductor substrate of first conductivity type. A pair of first diffused layers of second conductivity type are formed on the substrate. A pair of second diffused layers of second conductivity type are respectively formed in the two first diffused layers and higher in concentration than the first diffused layers. A gate region intervenes between the two first diffused layers facing each other, and consists of a gate oxide film and a gate electrode. The distance between the first diffused layers is smaller in a deep region of the substrate than at the surface of the same.

Also, in accordance with the present invention, a high voltage MOS transistor has a semiconductor substrate of first conductivity type. A pair of first diffused layers of second conductivity type are formed on the substrate. A pair of second diffused layers of second conductivity type are respectively formed in the two first diffused layers and higher in concentration than the first diffused layers. A gate region intervenes between the pair of first diffused layers facing each other, and consists of a gate oxide film and a gate electrode. A third diffused layer of first conductivity type is formed in a deep region of the substrate and contacts the first diffused layers. The third diffused layer is lower in concentration than the substrate.

Further, in accordance with the present invention, a method of producing a high voltage MOS transistor has the steps of forming a pair of first diffused layers of second conductivity type on a semiconductor substrate of first conductivity type, diffusing an impurity of first conductivity type, with lower concentration than the first diffused layers, on the entire surface of the substrate over the first diffused layers while further diffusing the first diffused layers, forming an oxide film in a field region surrounding the first diffused layers, forming a gate electrode bridging the first diffused layers, forming a pair of second diffused layers of second conductivity type and of a high concentration in the two first diffused layers, respectively, forming an intermediate insulating layer, and then forming a wiring while setting up electrical contact.

Moreover, in accordance with the present invention, a method of producing a high voltage MOS transistor has the steps of forming a pair of first diffused layers of second conductivity type on a semiconductor substrate of first conductivity type, forming an epitaxial layer of first conductivity type on the entire surface of the substrate and then diffusing the first diffused layers, forming an oxide film in a field region surrounding the first diffused layers, forming a gate electrode bridging the first diffused layers, forming a pair of second diffused layers of second conductivity type and of a high concentration in the first diffused layers, respectively, forming an intermediate insulating layer, and then forming a wiring while setting up electrical contact.

In addition, in accordance with the present invention, a method of producing a high voltage MOS transistor has the steps of forming a pair of first diffused layers of second conductivity type on a semiconductor substrate of first conductivity type, forming an impurity region (contacting the first diffused layers) of second conductivity type and of a preselected impurity concentration in a deep region of the substrate over the entire area of the deep region, further diffusing the first diffused layers while forming a third diffused layer of first conductivity type (the third layer is lower in concentration than the substrate and contacts the first diffused layers) in a deep region of the substrate, forming an oxide film in a field region surrounding the first diffused layers, forming a pair of second diffused layers of second conductivity type and having a high concentration in the diffused layers, respectively, forming an intermediate insulating layer, and then forming a wiring while setting up electrical contact.

BRIEF DESCRIPTION OF THE DRAWINGS

The objects and features of the present invention will become more apparent from the consideration of the following detailed description taken in conjunction with the accompanying drawings in which:

FIGS. 5A–5E are sections showing a sequence of steps for producing a conventional offset gate MOS transistor;

DESCRIPTION OF THE PREFERRED EMBODIMENTS

Figure 1A:
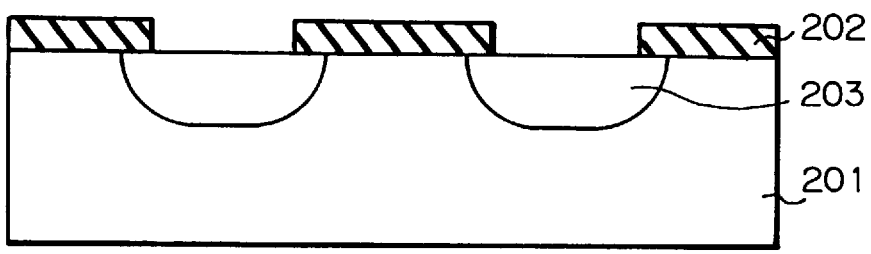
FIG. 1A–1E are sections showing a sequence of steps for producing a high voltage MOS transistor embodying the present invention.
Figure 13:
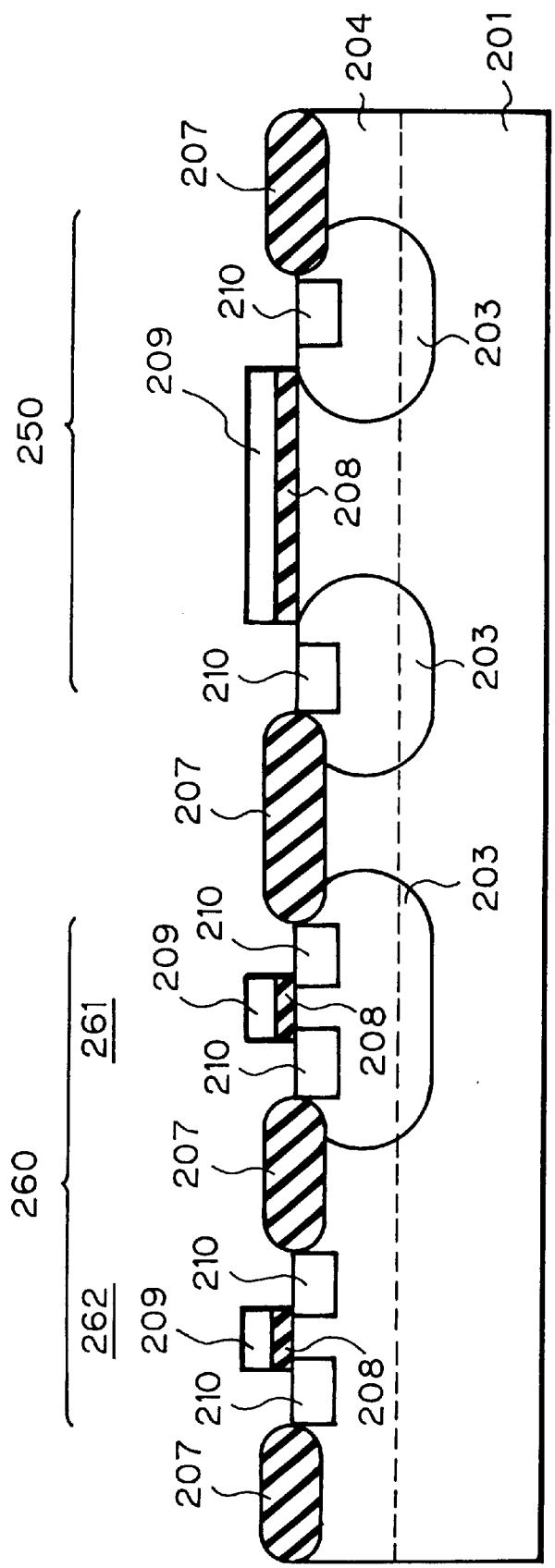
FIG. 13 is a section showing a specific chip having both a CMOS circuit and a high voltage MOS transistor of the present invention therein.

Referring to FIGS. 1A–1E, a sequence of steps for fabricating a high voltage MOS transistor embodying the present invention will be described. First, as shown in FIG. 1A, a P type silicon substrate 201 is subjected to thermal oxidation in order to form an about 500 nm thick oxide film 202 in the surface thereof. Then, the oxide film 202 is partly removed by photolithographic etching, thereby forming a mask having a preselected pattern. Phosphorus (P) is introduced into the substrate 201 by ion implantation over the mask 202 in a dose of about 1E13 ions/cm$^2$. Subsequently, the substrate 201 with the mask 202 is treated by heat at 1,200°0 C. for about 3 hours. As a result, N type or second conductivity type wells 203 are formed in the substrate 201. The N type wells 203 constitute first diffused layers. As shown in FIG. 13, the N type wells 203 are used to form a logic portion (P type MOS) 261 for a 5 V application at the same time.

Figure 1B:
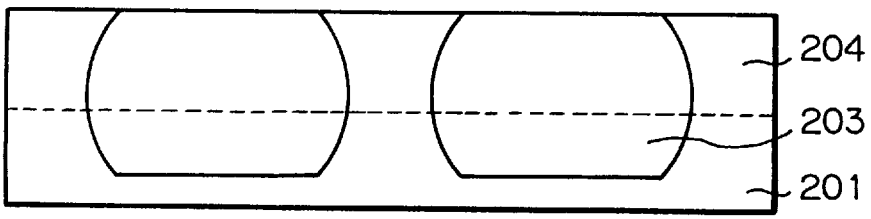

As shown in FIG. 1B, the entire mask 202 is removed by etching from the substrate 201 formed with the N type wells 203 by the above heat treatment. In this condition, boron (B), i.e., an impurity of first conductivity type is implanted in the entire surface of the substrate 201 by ion implantation, and then the substrate is again treated by heat at 1,200° C. for about 3 hours. As a result, the N type wells 203 and a P type well 204 are formed in the substrate 201. At this instant, the dose of the P type well 204 is selected to be 6E12 ions/cm$^2$. This allows the distance between the N type wells 203 facing each other to be great at the surface of the substrate 201, but small at the deep region of the same, due to the counterdoping of the P type wells 204.

Figure 1C:
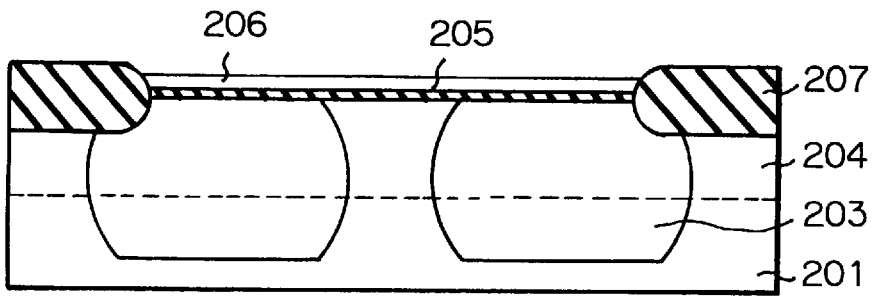

Subsequently, as shown in FIG. 1C, an oxide film 205 and a nitride film 206 are sequentially formed on the entire surface of the substrate 201. Then, only the nitride film 206 is patterned by photolithographic etching so as to form a mask. The substrate 201 with the mask 206 is subjected to thermal oxidation in order to form an about 1,000 nm thick oxide film 207 in the field region surrounding the N wells 203.

Figure 1D:
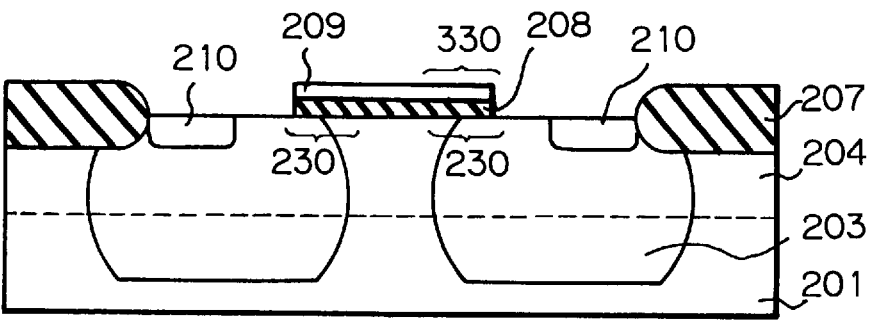

As shown in FIG. 1D, the oxide film 205 and nitride film 206 are removed from the substrate 201. Then, the substrate 201 is subjected to thermal oxidation in order to form a gate oxide film 208 thereon. Subsequently, polycrystalline silicon (Poly-Si) is deposited on the entire surface of the substrate 201 by CVD (Chemical Vapor Deposition). Thereafter, the Poly-Si is removed from the area of the substrate other than the gate area of a MOS transistor by photolithographic etching, forming a gate electrode 209 bridging the N wells 203. Then, N+ diffused layers 210 are respectively formed in the N type wells 203 by photolithographic ion implantation. The diffused layers 210 constitute second diffused layers of second conductivity type and will serve as a source and a drain, respectively.

Figure 1E:
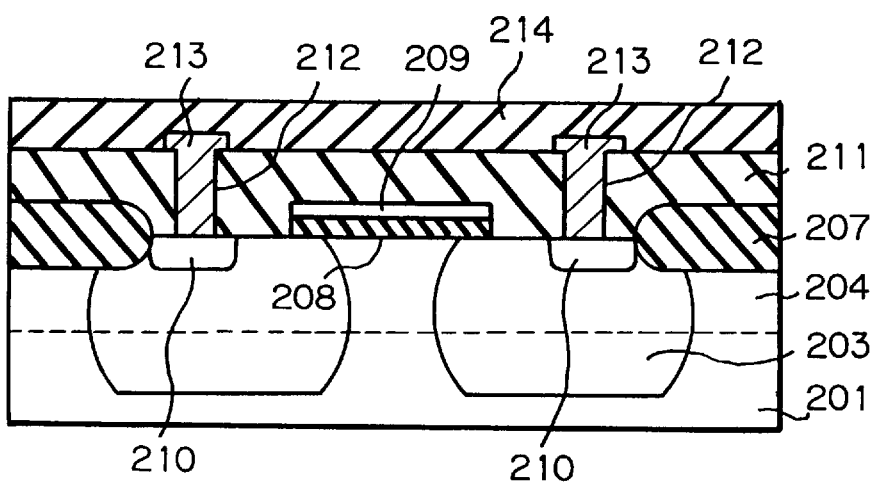

As shown in FIG. 1E, an intermediate insulating film 211 is formed on the substrate 201 over the diffused layers 210 and then formed with contact holes 212 by photolithographic etching. Subsequently, aluminum alloy or similar wiring metal is formed and then partly removed by photolithographic etching in order to form a wiring 213. Finally, a passivation film 214 is formed over the entire surface of the substrate 201 over the wiring 213. This completes a high voltage MOS transistor.

Figure 2:
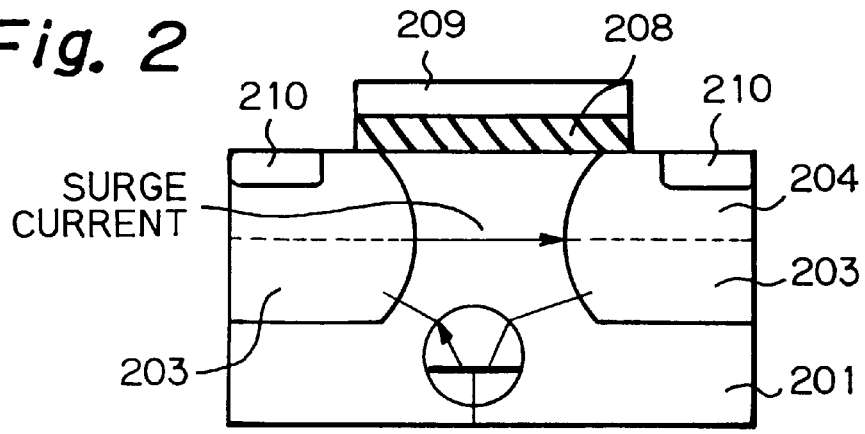
FIG. 2 is a schematic section showing the embodiment of FIGS. 1A–1E.

As stated above, in the illustrative embodiment, a field relaxing layer for realizing a high breakdown voltage is formed by the N type wells 203 counterdoped by the P type well 204. Consequently, as shown in FIG. 2, a parasitic bipolar transistor has a base width smaller in the inside of the substrate 201 than at the surface of the same. In this condition, static electricity or similar surge current flows through the inside of the substrate 201, so that heat ascribable to the serge current is scattered in the substrate 201. This insures a great breakdown resisting quantity.

Figure 3:
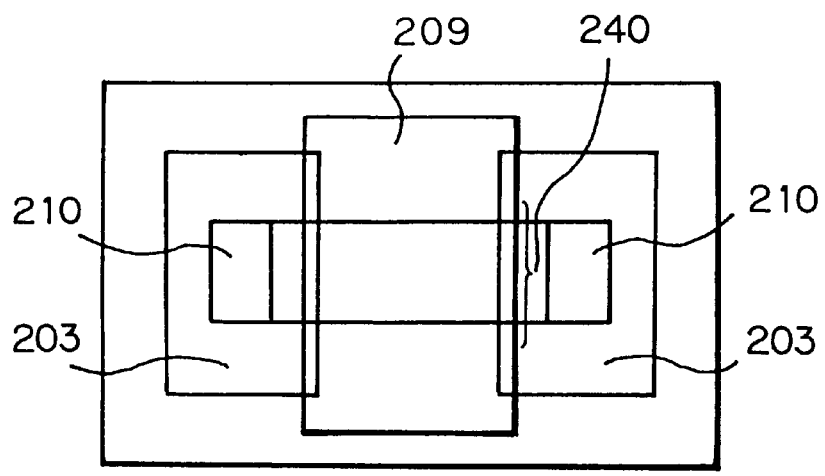
FIG. 3 is a schematic plan view also showing the embodiment of FIGS. 1A–1E.

Further, because the gate electrode 209 is provided with an edge configuration similar to that of an ordinary MOS transistor for 5V applications, the electric field in the transistor is maximum at the edge of the electrode 209. Therefore, as shown in FIG. 3, a surge current is scattered in the widthwise direction 240 of the gate. This provides the breakdown resisting quantity with dependency on the width of the gate.

The conventional high voltage MOS transistor having the structure shown in FIG. 5E includes the offset layers 106. This prevents such a MOS transistor from incorporating the edge structure of the gate electrode of a MOS transistor for 5 V applications, as will be discussed specifically hereinafter.

Even the high voltage MOS transistor produced by the procedure of FIGS. 5A–5E may be provided with the edge structure of the gate electrode of the 5 V MOS transistor if the oxide film 107 is removed from the offset layers 106 before the formation of the gate oxide layer 108. However, this is undesirable because the distance between the field relaxing layer, i.e., offset layers 106 underlying the edges 120 of the gate electrode 109 and the edges 120 would be reduced, causing the potential of the electrode 109 to effect the potential inside the layers 106. Specifically, a high voltage region would be formed in the field relaxing layer 106, and a depletion layer would be formed in the layer 106 shown in FIG. 5E. However, the field relaxing layer 106 shown in FIG. 5E is smaller than the relaxing layer or N wells 203 of the illustrative embodiment, limiting the extension of the depletion layer associated therewith.

Assume that breakdown (primary breakdown, i.e., avalanche breakdown or Zener breakdown) occurs at a voltage below the junction breakdown voltage which the field relaxing layer 106 has when the oxide film 107 is present as shown in FIG. 5E, due to an intense electric field. The operation voltage of the offset gate MOS transistor cannot be guaranteed because it is set on the basis of the PN junction breakdown voltage of the field relaxing layer. Then, a surge current flows only locally through a surface of the substrate 101. As a result, the temperature of the substrate 101 is locally and utterly elevated and causes the PN junction to melt (secondary breakdown, i.e., breakdown of the semiconductor device.)

By contrast, as shown in FIG. 1E, the field relaxing layer 203 of the illustrative embodiment is broad and deep. Therefore, a region allowing a depletion layer to extend to a sufficient degree is available in the field relaxing layer 203. It follows that even when the primary breakdown occurs at a voltage below the junction breakdown voltage of the field relaxing layer 203, the depletion layer extending sufficiently before the primary breakdown guarantees the operation voltage and allows a surge current to flow over a broad area inside of the substrate 201. This prevents the PN junction from melting and thereby protects the semiconductor device from breakdown. In this manner, the illustrative embodiment achieves a great breakdown resisting quantity.

Regarding the area of a single semiconductor device, the embodiment is greater than the conventional device shown in FIG. 5E. However, when it comes to the entire IC (Integrated Circuit), the embodiment has a smaller area than the conventional device because it does not need a protection device against breakdown.

Figure 4:
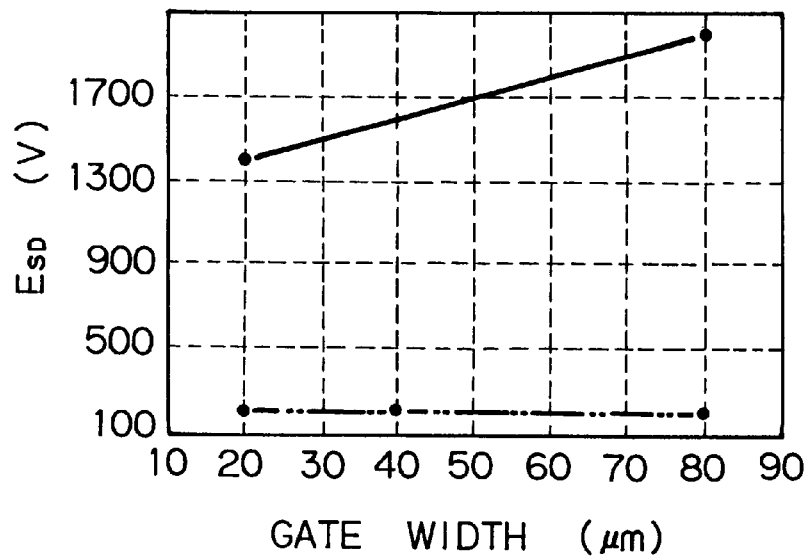
FIG. 4 is a graph comparing the embodiment of FIGS. 1A–1E and a conventional offset MOS transistor with respect to breakdown resisting quantity.
Figure 6:
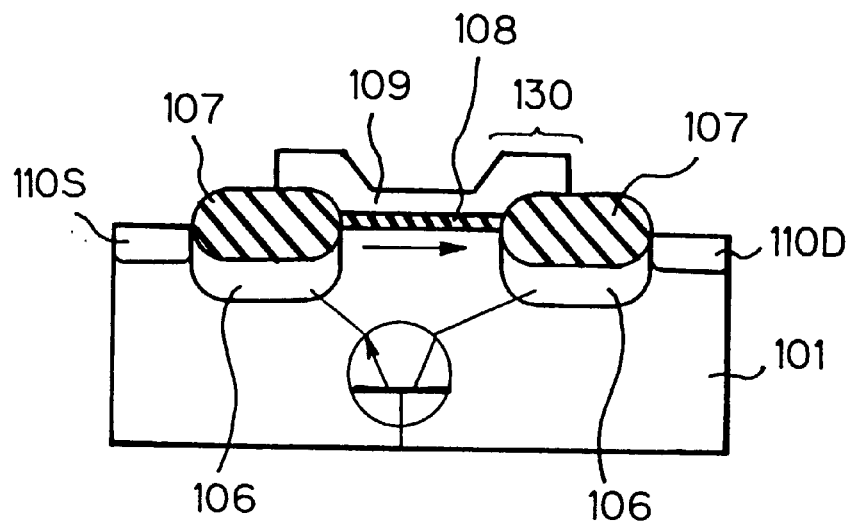
FIG. 6 is a schematic section of the transistor shown in FIG. 5E.
Figure 7:
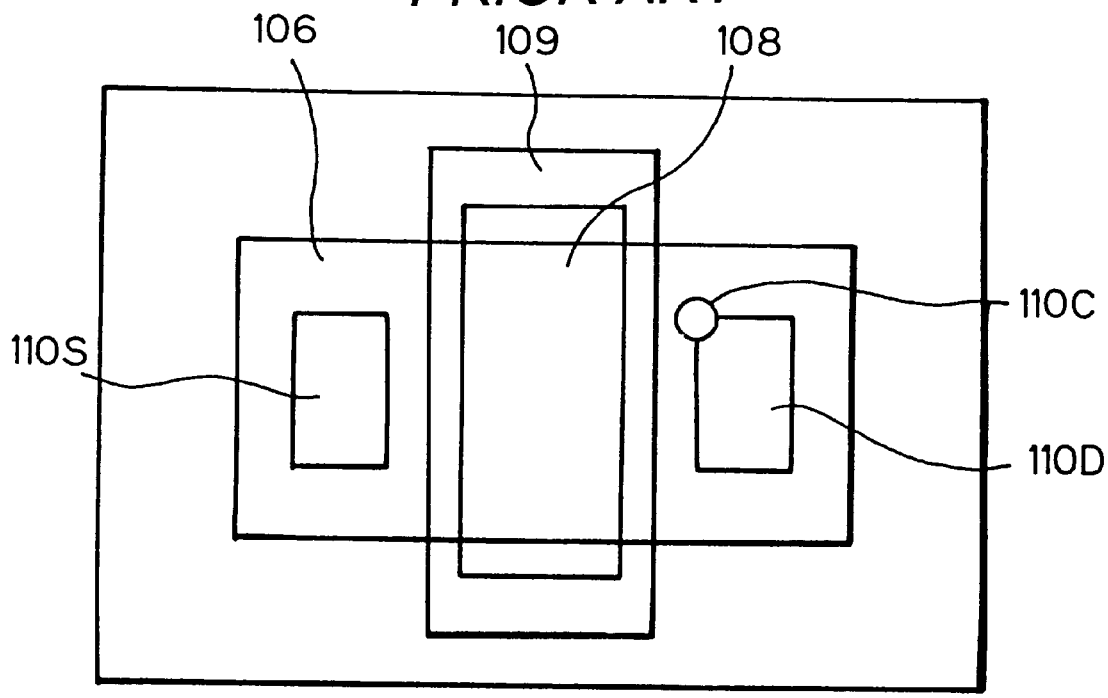
FIG. 7 is a schematic plan view of the transistor shown in FIG. 5.

FIG. 4 compares the above embodiment and the conventional high voltage MOS transistor as to the breakdown resisting quantity. In FIG. 4, the abscissa and ordinate respectively indicate the gate width ($\mu$m) and the voltage (V) applied to between the source and the drain. A solid curve and a dash-and-dots curve are representative of the embodiment and conventional transistor, respectively. As FIG. 5 indicates, the embodiment is far higher than the conventional transistor as to the breakdown resisting quantity. Further, the embodiment is capable of reducing the chip area, as stated above. In addition, as shown in FIG. 13, assume that a high voltage MOS transistor 250 of any one of the above embodiments and an ordinary CMOS control circuit 260 are mounted on a single chip; the control circuit 260 consists of a PMOS 261 and an NMOS 262. Then, the N well 203 constituting the field relaxing layer of the transistor 250 can be used to form the PMOS 261. Should the control circuit shown in FIG. 13 and the conventional high voltage MOS transistor shown in FIG. 5E be mounted on a single chip, it would be necessary to form the offset layers 106 by an extra step.

Figure 8A:
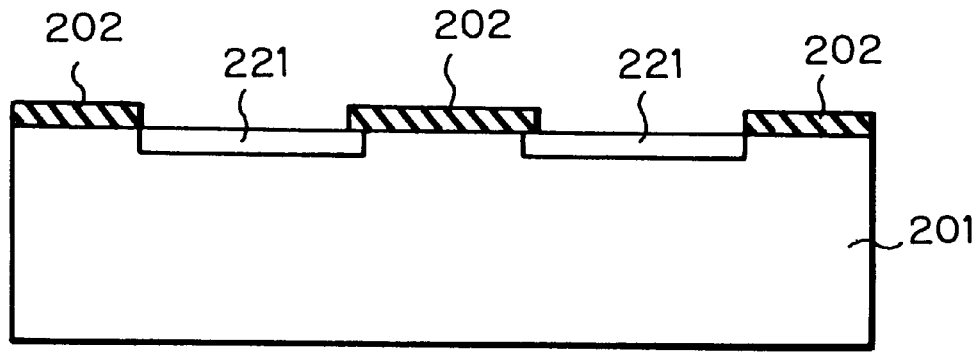
FIGS. 8A–8C are sections showing a sequence of steps representative of an alternative embodiment of the present invention.
Figure 8B:
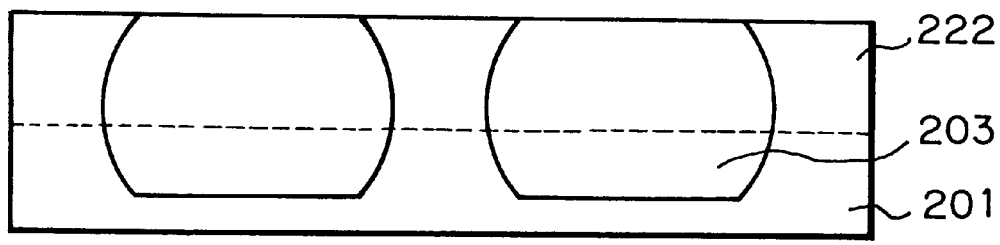
Figure 8C:
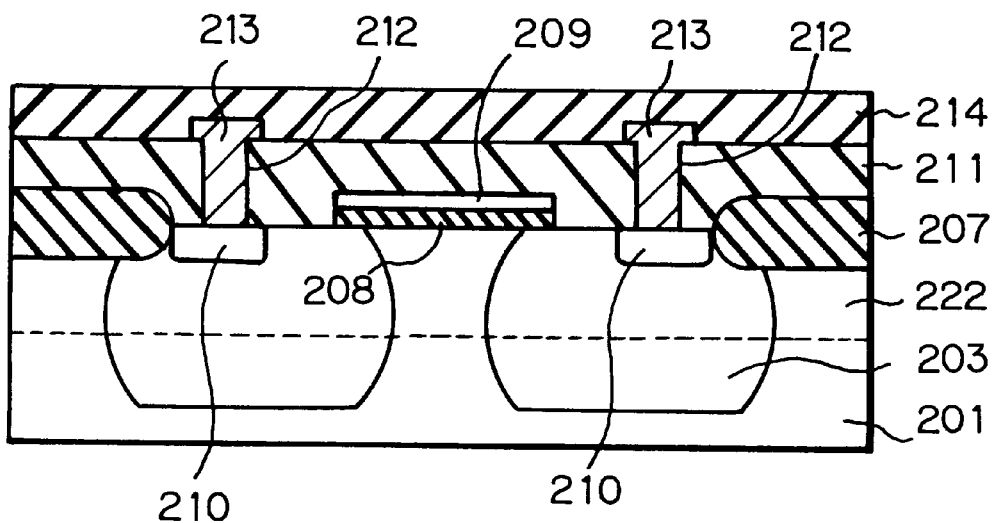

Referring to FIGS. 8A–8C, an alternative embodiment of the present invention will be described. First, as shown in FIG. 8A, the P type silicon substrate 201 is subjected to thermal oxidation in order to form the about 500 nm Å thick oxide film 202 in the surface thereof. Then, the oxide film 202 is partly perforated by photolithographic etching. P (phosphorus) is introduced into the substrate 201 over the remaining oxide film or mask 202 by ion implantation in a doze of 1E13 ions/cm$^2$. Subsequently, the substrate 201 is treated by heat at 1,000° C. for about 30 minutes. As a result, N type buried layers 221 are formed on the substrate 201.

Figure 9A:
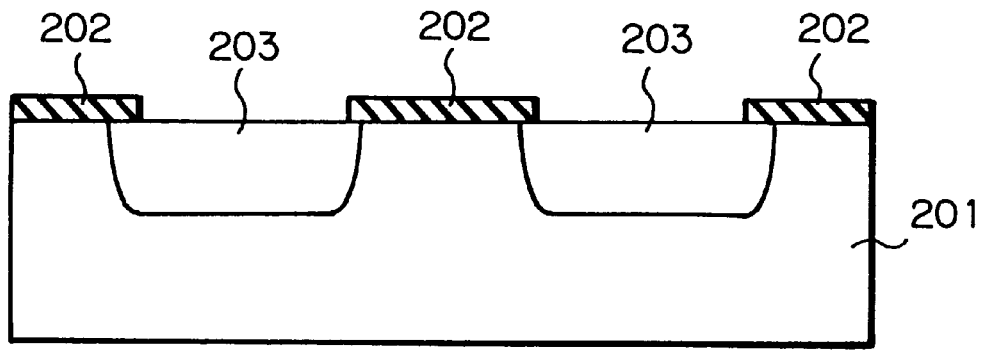
FIGS. 9A–9C are sections showing a sequence of steps representative of another alternative embodiment of the present invention.

As shown in FIG. 8B, the oxide film 202 formed in the step of FIG. 9A is removed by etching. Then, a P type epitaxial layer 222 having substantially the same specific resistance as the substrate 201 is caused to grow to a thickness of about 3 $\mu$m. The substrate 201 with the epitaxial layer 222 is subjected to heat treatment in order to form the N wells 203. This is followed by the steps previously described with reference to FIGS. 1C–1E.

In this embodiment, the N wells 203 of the high voltage MOS transistor is formed by the diffusion of the N type buried layers 221, as stated above. This makes it needless to control the density of a P well and thereby allows the small base width of a parasitic bipolar transistor to be formed in the deep portions of the N wells 203.

Furthermore, as to the region where the small base width is formed, this embodiment has a greater emitter-to-base concentration ratio than the previous embodiment, further improving the breakdown resisting quantity. This is because the previous embodiment implants B (boron) and diffuses it in the upper halves of the N wells 203. Specifically, the N type impurity concentration in the upper halves of the N wells 203 is lower in the previous embodiment than in this embodiment which does not effect the implantation of B or the diffusion thereof.

Moreover, as to the actual products, the previous embodiment is limited in P well concentration in relation to other transistors to be formed on the P well. By contrast, this embodiment allows the P type epitaxial layer 222 to be provided with any desired concentration. Hence, this embodiment is applicable to a broad range of products.

Specifically, in the previous embodiment, the field relaxing layer 203 is based on the concentration balance (counter doping) between the P well 204 and the N wells 203. Therefore, the tolerable concentration range of the P well 204 and that of the N wells 203 restrict each other. In addition, the concentration of the P well 204 is sometimes restricted by the performance (including breakdown voltage) of other transistors to be formed on the P well 204. As a result, the concentration of the N wells 203 and therefore the performance of the entire transistor is limited. In this manner, the performance of the transistor produced by the steps shown in FIGS. 1A–1E is determined by the performance of other transistors to be formed on the P well 204. Stated another way, the performance of this transistor determines the performance of other transistors to be formed on the P well 204.

In this embodiment, the field relaxing layer is implemented by the epitaxial layer 222. This allows the concentration of the P type epitaxial layer 222 and that of the N wells 203 to be selected independently of each other. Therefore, the performance of transistors to be formed on the P type epitaxial layer 222 does not effect the concentration of the N wells 203, i.e., the performance of the transistor, as shown in FIG. 8. It follows that the transistor produced by the steps shown in FIGS. 8A–8C can be combined with other transistors each having a particular performance.

Another alternative embodiment of the present invention will be described with reference to FIGS. 9A–9C. First, as shown in FIG. 9A, the P type silicon substrate 201 is subjected to thermal oxidation in order to form the about 500 nm thick oxide layer 202 in the surface thereof. Then, the oxide film 202 is partly r e moved by photolithographic etching. P (phosphorus) is introduced into the substrate 201 by ion implantation in a doze of 1E13 ions/cm$^2$ with the remaining oxide film 202 serving as a mask. Subsequently, the substrate 201 is treated by heat at 1,200° C. for about 3 hours. As a result, the N wells 203 are formed in the substrate 201.

Figure 9B:
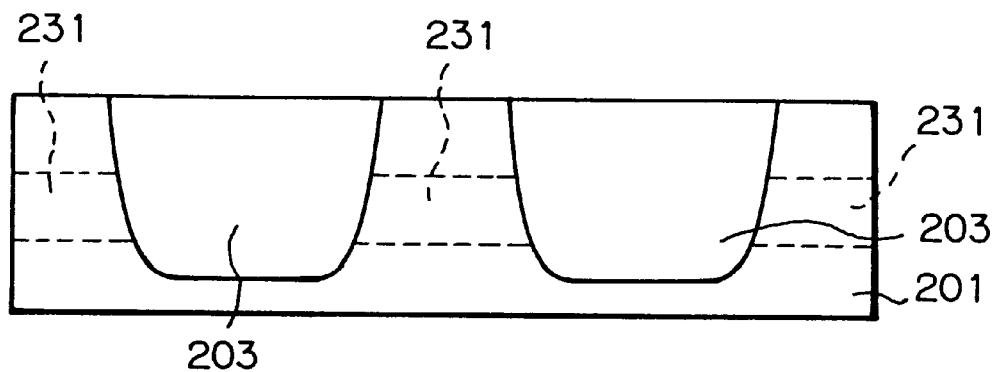

As shown in FIG. 9B, after the oxide film 202 has been removed, P (phosphorus) is implanted in the 2 $\mu$m to 3 $\mu$m deep region of the substrate 201 by high energy ion implantation. This ion implantation is effected with a desired dose necessary for counterdoping. Then, the substrate 201 is subjected to heat treatment at 1,200° C. for about 3 hours in order to form a P$^-$ layer or third diffused layer of first conductivity type 231. This is also followed by the sequence of steps shown in FIGS. 1C–1E In the high voltage MOS transistor produced by the above procedure, the P$^-$ layer 231 formed by high energy ion implantation increases the current amplification constant of the parasitic bipolar transistor disposed in the deep regions of the N wells 203. Consequently, the breakdown resisting quantity can be increased without varying the surface concentration of the substrate 201. This embodiment also achieves the advantages of the embodiments shown in FIGS. 8A–8C, but at a lower cost.

In summary, it will be seen that the present invention provides a high voltage MOS transistor and a method of producing the same which have various unprecedented advantages, as enumerated below.

(1) A field relaxing layer for implementing a high breakdown voltage is formed by N wells or first diffused layers counterdoped by a P well, as shown in FIG. 1E. In this condition, the base width of a parasitic bipolar transistor is smaller in the inside of a substrate than at the surface of the substrate, as shown in FIG. 2, so that static electricity or similar surge current flows through the inside of the substrate having a broad junction area. Therefore, heat resulting from the surge current is scattered in the substrate. This successfully increases the breakdown resisting quantity of the transistor.

Figure 9C:
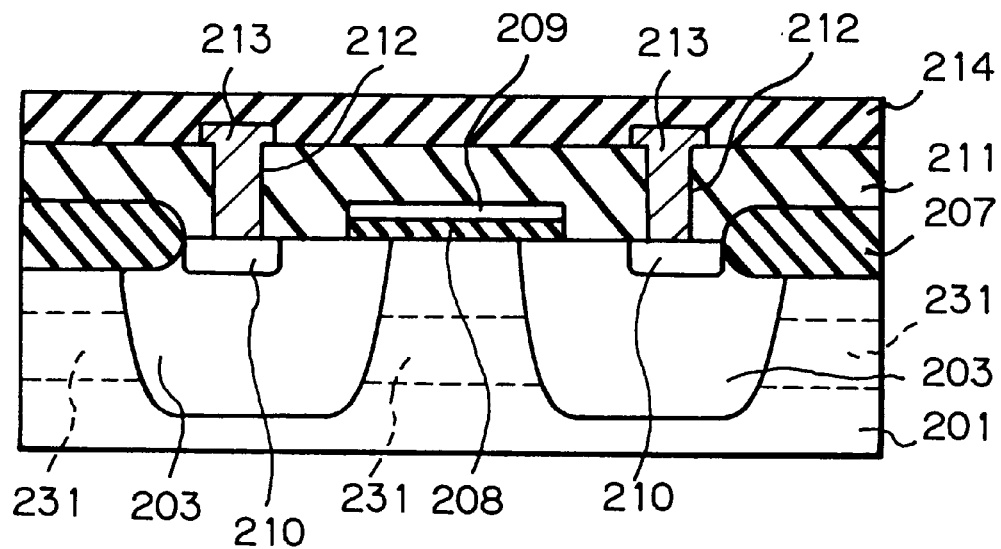
Figure 10:
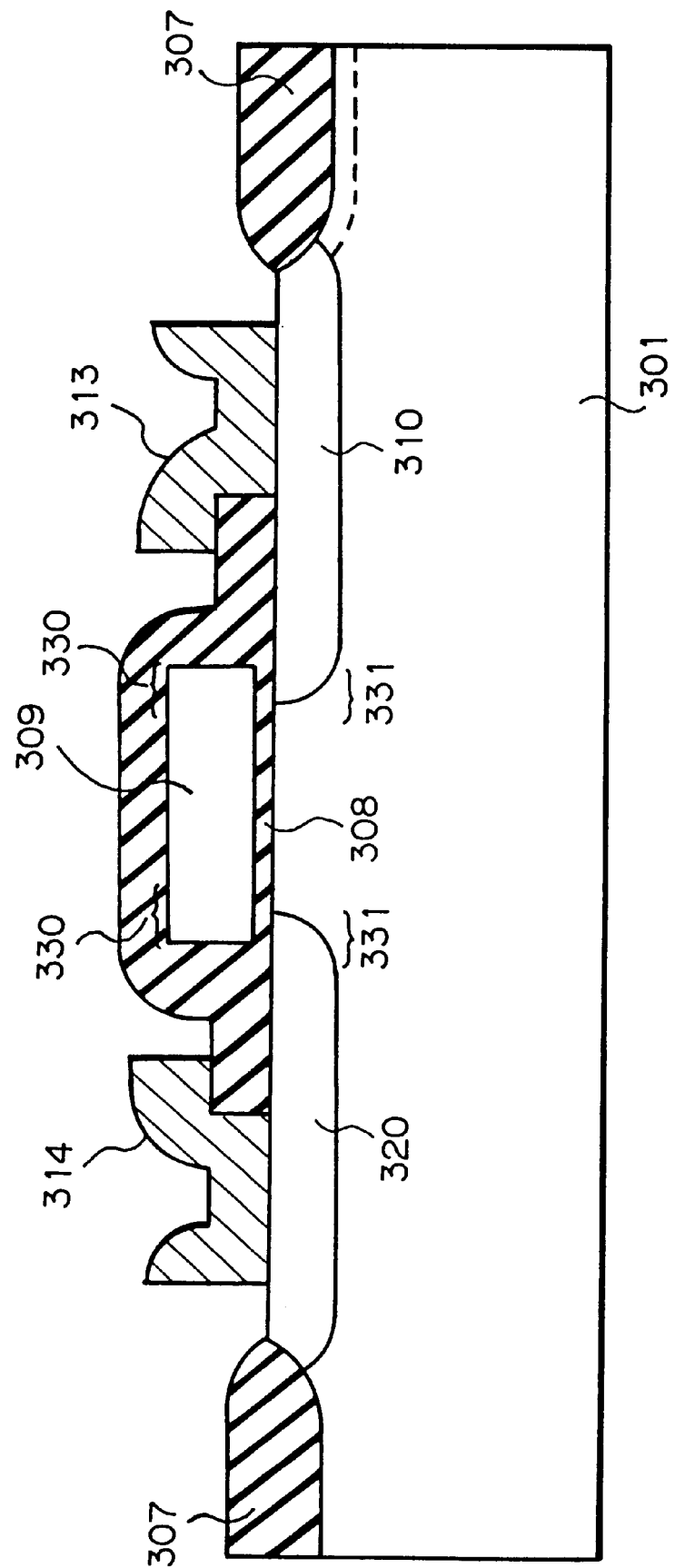
FIG. 10 is a section showing a conventional MOS transistor for 5V applications.
Figure 11:
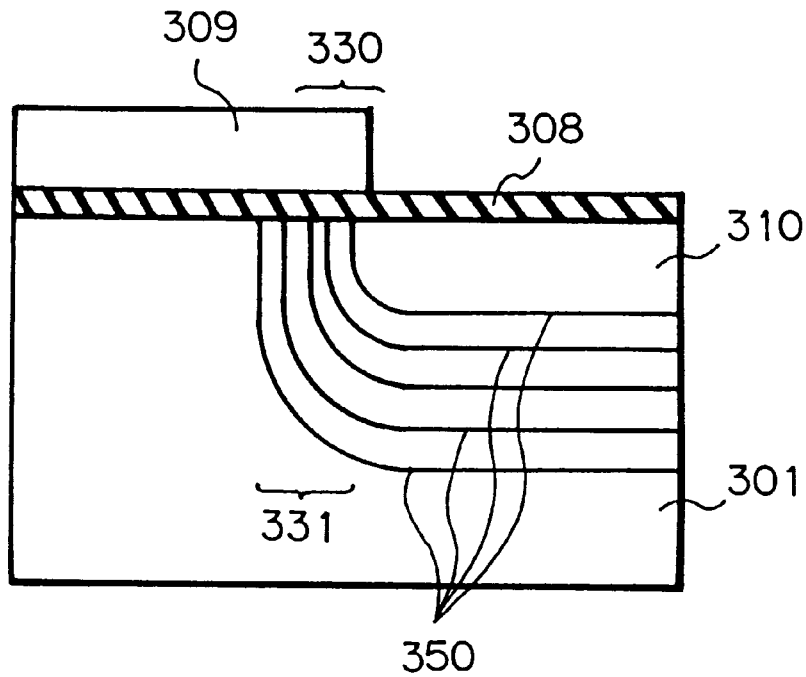
FIG. 11 is a view schematically showing a potential distribution in the transistor of FIG. 10.
Figure 12:
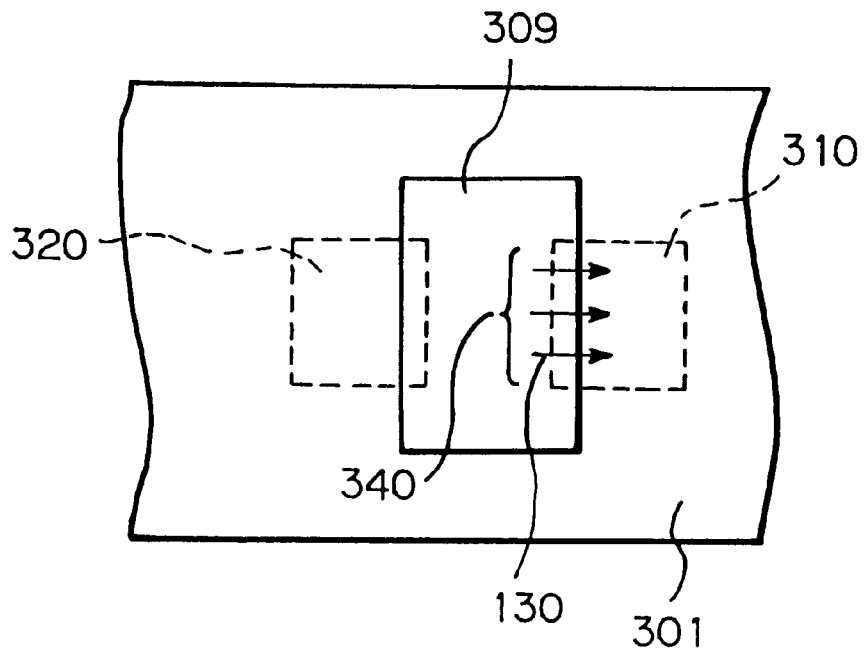
FIG. 12 is a plan view of the transistor shown in FIG. 10.

(2) The MOS transistor shown in FIG. 9C includes a P⁻ layer of first conductivity type in its deep region. The P⁻ layer contacts the first diffused layers and has a lower concentration than the substrate. This increases the current amplification constant of the parasitic bipolar transistor disposed in the deep regions of the N wells.

(3) The MOS transistor produced by the method of FIGS. 1A–1E allows static electricity or similar surge current to flow through the inside of the substrate having a broad junction area. As a result, heat resulting from the surge current is scattered in the substrate. This provides the transistor with a great breakdown resisting quantity. Further, the edges of the first diffused layers are positioned just below a gate electrode with the intermediary of the thin gate oxide film, i.e., the gate electrode has an edge structure similar to that of an ordinary MOS transistor for 5 V applications. Hence, the electric field in the transistor is maximum at the edges of the gate electrode. Consequently, the surge current is scattered in the widthwise direction of the gate, as shown in FIG. 3. This provides the breakdown resisting quantity with dependency on the gate width.

The transistor is far greater in breakdown resisting quantity than a conventional offset MOS transistor, as shown in FIG. 4. This, coupled with the fact that the transistor does not need a protection circuit, allows the chip area to be reduced. The field relaxing layer is implemented by the N wells for forming an ordinary MOS transistor for 5 V applications, so that the number of masking steps is reduced.

(4) In the MOS transistor produced by the method of FIGS. 8A–8C, the N wells are formed by the diffusion of N type buried layers. In this case, the control over the concentration of the P well as effected in the transistor of FIGS. 1A–1E is not necessary. Therefore, the small base width of the parasitic bipolar transistor can be readily formed in the deep regions of the N wells. The breakdown resisting quantity available with this transistor is even greater than the quantity of the transistor shown in FIGS. 1A–1E. This is because the difference in concentration between the emitter and the base in the region where the small base width is formed is greater than in the transistor of FIGS. 1A–1E, increasing the current amplification constant.

Specifically, the emitter-to-base concentration ratio is proportional to the current amplification factor $h_{FE}$, as well known in the art. As the current amplification factor increases, i.e., as a current is allowed to flow more easily, much of the surge current flows through the region where the small base width is formed, i.e., where thermal diffusion occurs easily. This successfully increases the breakdown resisting quantity.

(5) The MOS transistor produced by the method of FIGS. 9A–9C has a P⁻ layer formed by high energy ion implantation. The P⁻ layer increases the current amplification constant of the parasitic bipolar transistor in the deep regions of the N wells, so that the breakdown resisting quantity is increased. The transistor is therefore lower in cost than the transistor of FIGS. 8A–8C. Specifically, the method of FIGS. 9A–9C completed in a shorter period of time than the method of FIGS. 1A–1E which varies the surface concentration of the substrate by subjecting the impurity introduced into the surface to heat treatment, or the method of FIGS. 8A–8C which varies it by time-consuming epitaxial growth.

While the present invention has been described with reference to the particular illustrative embodiments, it is not to be restricted by the embodiments. It is to be appreciated that those skilled in the art can change or modify the embodiments without departing from the scope and spirit of the present invention. For example, while the embodiment shown in FIGS. 1A–1E is implemented as an N type high voltage MOS transistor, it may alternatively be implemented as a P type high voltage MOS transistor by replacing the N and P types of the diffused layers. Although each embodiment has been shown and described on the assumption that a MOS transistor for 5 V applications is formed at the same time as the high voltage MOS transistor, it is not necessary for the field relaxing layer and counterdoping layer to be implemented by wells.

What is claimed is:

1. A high voltage MOS transistor comprising:

a semiconductor substrate of a first conductivity type and having a principal top surface and a principal bottom surface;

a pair of first diffused layers of a second conductivity type formed in said principal top surface of said semiconductor substrate and spaced apart along said principal top surface of said semiconductor substrate;

a pair of second diffused layers of said second conductivity type respectively formed in said pair of first diffused layers, said pair of second diffused layers having a concentration which is higher than that of said pair of first diffused layers and having a depth and a width which are less than those of said pair of first diffused layers;

a gate region extending between said pair of first diffused layers, and comprising a gate oxide film and a gate electrode; and a third diffused layer of said first conductivity type formed in a buried region of said semiconductor substrate spaced from both said principal top surface and said principal bottom surface of said semiconductor substrate, said third diffused layer extending between and contacting said pair of first diffused layers, and having a concentration which is lower than that of a first region of said semiconductor substrate extending between said pair of first diffused layers and above said third diffused layer and a second region of said semiconductor substrate extending below said third diffused layer, wherein said third diffused layer is buried at a depth of from 2 $\mu$m to 3 $\mu$m from said principal top surface of said semiconductor substrate.

\* \* \* \* \*